United States Patent
Kikuchi et al.

(10) Patent No.: US 12,378,659 B2
(45) Date of Patent: Aug. 5, 2025

(54) METAL MATERIAL, METHOD OF PRODUCING METAL MATERIAL, METHOD OF PASSIVATING SEMICONDUCTOR PROCESSING APPARATUS, METHOD OF MANUFACTURING SEMICONDUCTOR DEVICE, AND METHOD OF MANUFACTURING FILLED CONTAINER

(71) Applicant: CENTRAL GLASS COMPANY, LIMITED, Yamaguchi (JP)

(72) Inventors: Akiou Kikuchi, Yamaguchi (JP); Ryoma Nomura, Yamaguchi (JP); Ryota Yoshimura, Yamaguchi (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 390 days.

(21) Appl. No.: 17/790,839

(22) PCT Filed: Nov. 19, 2020

(86) PCT No.: PCT/JP2020/043200
§ 371 (c)(1),
(2) Date: Jul. 5, 2022

(87) PCT Pub. No.: WO2021/140757
PCT Pub. Date: Jul. 15, 2021

(65) Prior Publication Data
US 2023/0029787 A1 Feb. 2, 2023

(30) Foreign Application Priority Data

Jan. 6, 2020 (JP) ................. 2020-000352

(51) Int. Cl.
C23C 12/00 (2006.01)
C23C 14/06 (2006.01)
C23C 16/30 (2006.01)
C23C 26/00 (2006.01)
F17C 1/10 (2006.01)

(52) U.S. Cl.
CPC .................. C23C 14/0694 (2013.01)

(58) Field of Classification Search
None
See application file for complete search history.

(56) References Cited

U.S. PATENT DOCUMENTS

| | | | |
|---|---|---|---|
| 5,009,963 | A | 4/1991 | Ohmi et al. |
| 5,234,679 | A | 8/1993 | Suenaga et al. |
| 2003/0091498 | A1 | 5/2003 | Kikuyama et al. |
| 2013/0034708 | A1* | 2/2013 | Ryu ............... H01L 21/67098 427/126.3 |
| 2017/0323772 | A1* | 11/2017 | Fenwick ............ C23C 16/4404 |
| 2018/0233770 | A1 | 8/2018 | Ein-Eli et al. |
| 2020/0173009 | A1 | 6/2020 | Yao et al. |
| 2021/0115556 | A1 | 4/2021 | Nagatomo et al. |

FOREIGN PATENT DOCUMENTS

| | | |
|---|---|---|
| CN | 103952677 | 7/2014 |
| CN | 108431994 | 8/2018 |
| JP | 49-43573 | 4/1974 |
| JP | 60-13074 | 1/1985 |
| JP | 2-263972 | 10/1990 |
| JP | 4-342423 | 11/1992 |
| JP | 2001-172020 | 6/2001 |
| JP | 2004-51999 | 2/2004 |
| JP | 2014-86579 | 5/2014 |
| JP | 2019-502253 | 1/2019 |
| WO | 2016/172740 | 10/2016 |
| WO | 2019/012841 | 1/2019 |
| WO | 2019-026682 | 2/2019 |

OTHER PUBLICATIONS

International Search Report issued Jan. 19, 2021 in corresponding International (PCT) Application No. PCT/JP2020/043200.
N. Lifshitz et al., "Selective Molybdenum Deposition by LPCVD", J. Electrochem. Soc., 1987, vol. 134, No. 8, pp. 2061-2067.
N. Lifshitz et al., "Comparative Study of the Low Pressure Chemical Vapor Deposition Processes of W and Mo", J. Electrochem. Soc., 1988, vol. 135, No. 7, 1832-1836.

* cited by examiner

*Primary Examiner* — Sheeba Ahmed
(74) *Attorney, Agent, or Firm* — Wenderoth, Lind & Ponack, L.L.P.

(57) ABSTRACT

The metal material of the present disclosure includes: a metal base; and a film provided on a surface of the metal base and containing a fluorine-containing molybdenum compound, the fluorine-containing molybdenum compound being represented by the formula $MoO_xF_y$, wherein x is a number from 0 to 2 and y is a number from 2 to 5.

11 Claims, 1 Drawing Sheet

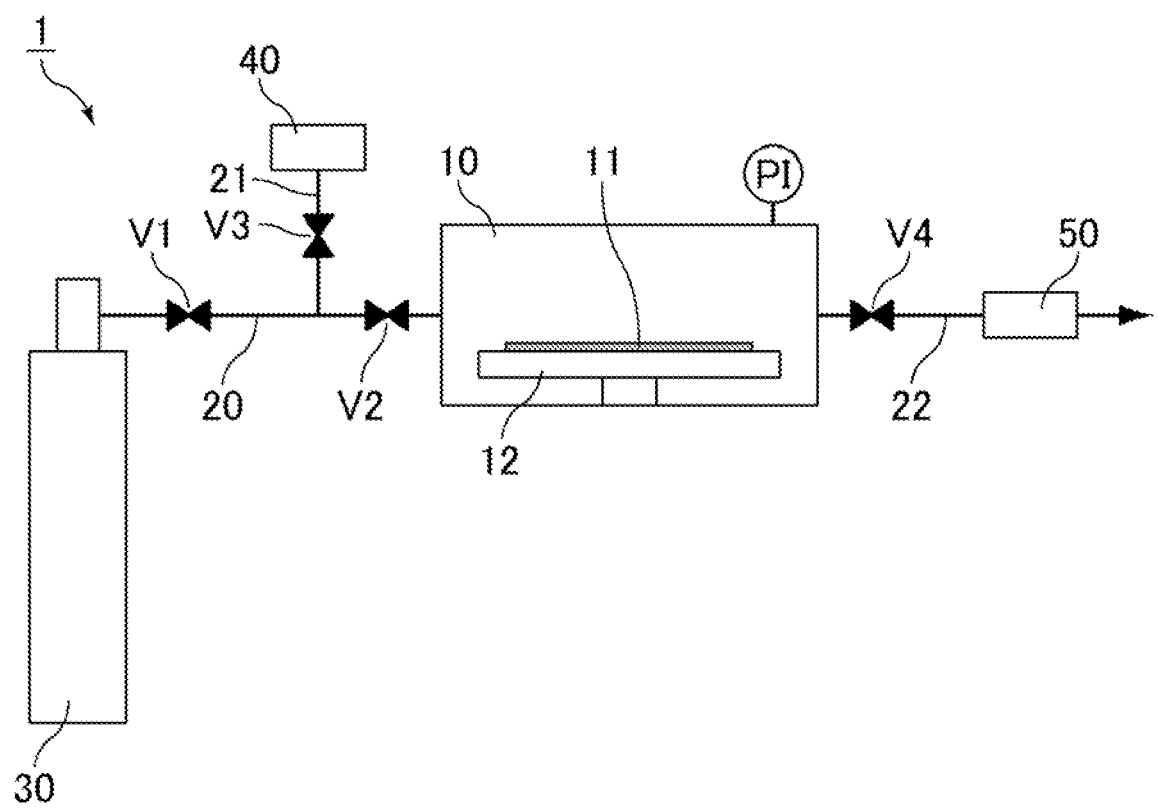

METAL MATERIAL, METHOD OF PRODUCING METAL MATERIAL, METHOD OF PASSIVATING SEMICONDUCTOR PROCESSING APPARATUS, METHOD OF MANUFACTURING SEMICONDUCTOR DEVICE, AND METHOD OF MANUFACTURING FILLED CONTAINER

TECHNICAL FIELD

The present disclosure relates to a metal material in which a film containing a fluorine-containing molybdenum compound is provided on a surface of a metal base. The present disclosure also relates to a method of producing the metal material, a method of passivating a semiconductor processing device, a method of producing a semiconductor device, and a method of producing a filled container.

BACKGROUND ART $MoF_6$ is a gas used as a Mo film-forming material and as an etching material in the semiconductor device production process. Non-Patent Literature 1, Non-Patent Literature 2, and Patent Literature 1 disclose that a reaction such as $MoF_6+3H_2 \rightarrow Mo+6HF$ can produce metal Mo.

Patent Literature 2 discloses that $MoF_6$ can be used as an etching material in the semiconductor device production process.

CITATION LIST

Patent Literature

Patent Literature 1: JP S49-43573 A
Patent Literature 2: JP 2019-502253 T

Non-Patent Literature

Non-Patent Literature 1: J. Electrochem. Soc., 134, 8, 2061 (1987)
Non-Patent Literature 2: J. Electrochem. Soc., 135, 7, 1832 (1988)

SUMMARY OF INVENTION

Technical Problem

However, the Mo film obtained using $MoF_6$ as a Mo film-forming material may not have sufficient electrical conductivity. This is presumably because particles contained in $MoF_6$ gas are taken into the Mo film and reduce the crystallinity of the Mo film, thus deteriorating electrical conductivity. Moreover, using particle-containing $MoF_6$ as an etching material may cause defects, such as a reduced etching rate at portions to which particles adhered, and may result in defective semiconductor devices.

To solve the above issues, the present disclosure aims to provide $MoF_6$ suitable for use in the semiconductor device production process.

Solution to Problem

The present inventors made intensive studies to find out that $MoF_6$ reacts with metal forming storage containers, pipes, chambers, and the like, thus reducing the purity of $MoF_6$ and also producing lower $MoF_x$ (x is 3, 4 or 5). The inventors also found out that the $MoF_x$, which has a high melting point, forms particles in the gas. These $MoF_x$ particles cause film formation defects when taken into the film, or cause defects in semiconductor devices when adhering to surfaces of semiconductor wafers.

The inventors found a method in which a surface of a metal base forming a metal material is preprocessed in advance using $MoF_6$ to form a film of $MoO_xF_y$ (molybdenum fluoride or molybdenum oxyfluoride), so that the reaction of $MoF_6$ with metal can be reduced to prevent the formation of particles and also a reduction in the purity of $MoF_6$.

The metal material of the present disclosure includes a metal base and a film provided on a surface of the metal base and containing a fluorine-containing molybdenum compound, the fluorine-containing molybdenum compound being represented by the formula $MoO_xF_y$, wherein x is a number from 0 to 2 and y is a number from 2 to 5.

In the metal material of the present disclosure, preferably, the metal base is made of at least one selected from the group consisting of a stainless steel, a manganese steel, aluminum, an aluminum alloy, nickel, and a nickel alloy.

In the metal material of the present disclosure, preferably, the film has a thickness of 1 nm or greater and 20 μm or smaller.

In the metal material of the present disclosure, preferably, the metal base is a pipe, a storage container, or a chamber, and the film is provided on an inner surface of the metal base.

The method of producing a metal material of the present disclosure includes exposing a surface of a metal base to a $MoF_6$-containing gas at a temperature of 300° C. or lower to form a film containing a fluorine-containing molybdenum compound on the surface of the metal base.

In the method of producing a metal material of the present disclosure, preferably, the gas has a $MoF_6$ concentration of 5 vol % or higher and 100 vol % or lower.

The method of passivating a semiconductor processing device of the present disclosure is a method of passivating a semiconductor processing device including a chamber made of a metal material and a pipe connected to the chamber, the method including exposing an inner surface of the chamber and an inner surface of the pipe to a $MoF_6$-containing gas at a temperature of 300° C. or lower to form a film containing a fluorine-containing molybdenum compound on the inner surface of the chamber.

In the method of passivating a semiconductor processing device of the present disclosure, preferably, the pipe is made of a metal material, and the film is formed also on the inner surface of the pipe.

The method of producing a semiconductor device of the present disclosure includes performing the method of passivating a semiconductor processing device, and passing a $MoF_6$-containing gas through the semiconductor processing device.

The method of producing a filled container of the present disclosure includes exposing an inner surface of a storage container made of a metal material to a $MoF_6$-containing gas at a temperature of 300° C. or lower to form a film containing a fluorine-containing molybdenum compound on the inner surface of the storage container, and filling the storage container with a $MoF_6$-containing gas.

Advantageous Effects of Invention

The present disclosure can provide $MoF_6$ suitable for use in the semiconductor device production process.

BRIEF DESCRIPTION OF DRAWINGS

FIG. 1 is a schematic view illustrating an example of a semiconductor processing device used in examples and comparative examples.

DESCRIPTION OF EMBODIMENTS

Hereinafter, the present disclosure is described in detail. The present disclosure is not limited to the following structures, and can be modified as appropriate without changing the gist of the present disclosure.

[Metal Material]

The metal material of the present disclosure includes a metal base and a film provided on a surface of the metal base and containing a fluorine-containing molybdenum compound.

In the metal material of the present disclosure, a film containing a fluorine-containing molybdenum compound is provided on the surface of the metal base, so that reaction of $MoF_6$ with metal is reduced. This in turn prevents the formation of particles and also a reduction in the purity of $MoF_6$.

The metal base may be a pipe, a storage container, or a chamber, for example. In this case, the film containing a fluorine-containing molybdenum compound is provided on an inner surface of the metal base.

Examples of the material forming the metal base include metals such as stainless steels, manganese steels, aluminum, aluminum alloys, nickel, and nickel alloys. The metal base is preferably made of a stainless steel or a manganese steel.

Examples of stainless steels that can be used include martensite stainless steels, ferrite stainless steels, austenite stainless steels, and other types of stainless steels. Particularly preferred are SUS304, SUS304L, SUS316, and SUS316L.

Examples of manganese steels that can be used include SMn420, SMn433, SMn438, and SMn443 specified in JIS G 4053:2016 and STH11 and STH12 specified in JIS G 3429:2013.

Examples of aluminum alloys that can be used include alloys of aluminum with copper, manganese, silicon, magnesium, zinc, nickel, and the like.

Examples of nickel alloys that can be used include Hastelloy and Inconel.

The surface of the metal base before the formation of the film may be processed into a mirror surface, if necessary.

The fluorine-containing molybdenum compound contained in the film is represented by the formula $MoO_xF_y$ (x is a number from 0 to 2 and y is a number from 2 to 5). The fluorine-containing molybdenum compound is molybdenum fluoride when x is 0. It is molybdenum oxyfluoride when x is not 0.

The composition of the fluorine-containing molybdenum compound can be identified by X-ray photoelectron spectroscopy (XPS). For example, a sample may be irradiated with soft X-rays such as Mg Kα rays (1253.6 eV) or Al Kα rays (1486.6 eV) to measure the kinetic energy of photoelectrons emitted from the sample surface. This provides information on the type, abundance, and chemical bonding state of the elements forming the sample surface.

The film preferably has a thickness of 1 nm or greater, more preferably 5 nm or greater. Meanwhile, the film preferably has a thickness of 20 μm or smaller, more preferably 5 μm or smaller, still more preferably 1 μm or smaller.

The thickness of the film can be measured by depth analysis combining XPS and argon ion beam etching.

The film containing a fluorine-containing molybdenum compound may be formed by, for example, exposing the surface of the metal base to a $MoF_6$-containing gas, as described in [Method of producing metal material] below.

[Method of Producing Metal Material]

The method of producing a metal material of the present disclosure includes exposing a surface of a metal base to a $MoF_6$-containing gas at a temperature of 300° C. or lower to form a film containing a fluorine-containing molybdenum compound on the surface of the metal base.

In the method of producing a metal material of the present disclosure, a film containing a fluorine-containing molybdenum compound is formed on the surface of the metal base, so that reaction of $MoF_6$ with metal is reduced. This in turn prevents the formation of particles and also a reduction in the purity of $MoF_6$.

First, for example, a pipe, a storage container, or a chamber is provided as the metal base. In this case, the film containing a fluorine-containing molybdenum compound is formed on an inner surface of the metal base.

The material forming the metal base may be any of the metals described in [Metal material]. The metal base is preferably made of a stainless steel.

The method of producing a metal material of the present disclosure may optionally include mirror polishing of the surface of the metal base by a method such as electropolishing. Metal bases such as pipes used in semiconductor production devices are preferably mirror-polished on their surface. Mirror-polishing the surface of the metal base can remove irregularities on the surface, allowing uniform formation of the film containing a fluorine-containing molybdenum compound. Moreover, removing irregularities can reduce the surface area of the metal base, thus reducing the amount of $MoF_6$ needed for forming the film. Here, this step may be omitted if the mirror polishing of the surface of the metal base is not necessary.

Next, the surface of the metal base is sufficiently dried, and then exposed to a $MoF_6$-containing gas. Thus, the film containing a fluorine-containing molybdenum compound is formed on the surface of the metal base.

The details of the film containing a fluorine-containing molybdenum compound are omitted, as they have been described in [Metal material].

Exposing the surface of the metal base to the $MoF_6$-containing gas at a high temperature enables rapid formation of the film containing a fluorine-containing molybdenum compound. However, too high a temperature may cause corrosion of the metal base, which may cause the formation of particles. Thus, the surface of the metal base is exposed to the $MoF_6$-containing gas preferably at a temperature of 300° C. or lower, more preferably 200° C. or lower, still more preferably 150° C. or lower. Meanwhile, the surface of the metal base may be exposed to the $MoF_6$-containing gas at for example a temperature of 0° C. or higher, preferably 20° C. or higher, more preferably 40° C. or higher.

The gas to which the surface of the metal base is exposed may be a gas containing 100 vol % $MoF_6$, or a gas of $MoF_6$ diluted with an inert gas such as nitrogen or argon.

The gas to which the surface of the metal base is exposed may have any $MoF_6$ concentration. A higher $MoF_6$ concentration enables more rapid formation of the film containing a fluorine-containing molybdenum compound. Moreover, a higher $MoF_6$ concentration enables more stable formation of a firmer film containing a fluorine-containing molybdenum compound. Thus, the gas preferably has a $MoF_6$ concentration of 100 vol %.

Too low a $MoF_6$ concentration decreases the forming speed of the film containing a fluorine-containing molybdenum compound, prolonging the time until the film is formed. This makes it difficult to efficiently form the film. Thus, the gas preferably has a $MoF_6$ concentration of 5 vol % or higher.

The surface of the metal base may be exposed to the $MoF_6$-containing gas at any pressure. For example, the pressure may be appropriately set within the range of 10 kPa or greater and 1 MPa or smaller. The pressure may be atmospheric pressure.

The surface of the metal base may be exposed to the $MoF_6$-containing gas for any duration. The duration may be appropriately set within the range of 1 minute or longer to 72 hours or shorter, for example.

The surface of the metal base may be exposed to $MoF_6$ by a method of sealing the $MoF_6$-containing gas in the metal base when the base is, for example, a pipe, a storage container, or a chamber. Sealing in the $MoF_6$-containing gas enables efficient formation of the film containing a fluorine-containing molybdenum compound. This method is preferable also in that it does not require an excessive amount of $MoF_6$.

If sealing in the $MoF_6$-containing gas is not possible, the surface of the metal base may be exposed to $MoF_6$ by passing the $MoF_6$-containing gas over the surface of the metal base. In this case, the $MoF_6$-containing gas is preferably heated to a predetermined temperature in advance.

[Method of Passivating Semiconductor Processing Device]

The method of passivating a semiconductor processing device of the present disclosure is a method of passivating a semiconductor processing device including a chamber made of a metal material and a pipe connected to the chamber, the method including exposing an inner surface of the chamber and an inner surface of the pipe to a $MoF_6$-containing gas at a temperature of 300° C. or lower to form a film containing a fluorine-containing molybdenum compound on the inner surface of the chamber.

In the method of passivating a semiconductor processing device of the present disclosure, preferably, the pipe is made of a metal material, and the film is formed also on the inner surface of the pipe.

In the method of passivating a semiconductor processing device of the present disclosure, a film containing a fluorine-containing molybdenum compound is formed on the inner surface of the chamber or the inner surface of the pipe, so that reaction of $MoF_6$ with metal is reduced. This in turn prevents the formation of particles in the semiconductor processing device and also a reduction in the purity of $MoF_6$.

In the method of passivating a semiconductor processing device of the present disclosure, the chamber is preferably made of any of the metals described in [Metal material]. The chamber is preferably made of a stainless steel.

In the method of passivating a semiconductor processing device of the present disclosure, when the pipe is made of a metal material, the pipe is preferably made of any of the metals described in [Metal material]. In this case, the metal forming the chamber and the metal forming the pipe may be the same as or different from each other.

In the method of passivating a semiconductor processing device of the present disclosure, the pipe may be made of a resin material. Examples of the resin material forming the pipe include fluororesins such as perfluoroalkoxyalkane (PFA), polychlorotrifluoroethylene (PCTFE), and polytetrafluoroethylene (PTFE).

In the method of passivating a semiconductor processing device of the present disclosure, preferable conditions for the exposure to the $MoF_6$-containing gas are the same as those for [Method of producing metal material].

[Method of Producing Semiconductor Device]

The method of producing a semiconductor device of the present disclosure includes performing the method of passivating a semiconductor processing device, and passing a $MoF_6$-containing gas through the semiconductor processing device.

The gas to pass through the semiconductor processing device may be a gas containing 100 vol % $MoF_6$, or a gas of $MoF_6$ diluted with an inert gas such as nitrogen or argon. The gas to pass through the semiconductor processing device may be the same as or different from the gas to which the inner surface of the chamber is exposed.

By passing the $MoF_6$-containing gas through the semiconductor processing device, for example, a Mo film can be formed on a substrate. Alternatively, by passing the $MoF_6$-containing gas through the semiconductor processing device, for example, at least part of a layer can be etched from a substrate that has a layer such as an oxide film. Through these processes, a semiconductor device can be produced.

[Method of Producing Filled Container]

The method of producing a filled container of the present disclosure includes exposing an inner surface of a storage container made of a metal material to a $MoF_6$-containing gas at a temperature of 300° C. or lower to form a film containing a fluorine-containing molybdenum compound on the inner surface of the storage container, and filling the storage container with a $MoF_6$-containing gas.

In the method of producing a filled container of the present disclosure, a film containing a fluorine-containing molybdenum compound is formed on the inner surface of the storage container, so that reaction of $MoF_6$ with metal is reduced. This in turn prevents the formation of particles in the storage container and also a reduction in the purity of $MoF_6$.

In the method of producing a filled container of the present disclosure, the storage container is preferably made of any of the metals described in [Metal material]. The storage container is preferably made of a stainless steel.

In the method of producing a filled container of the present disclosure, preferable conditions for the exposure to the $MoF_6$-containing gas are the same as those for [Method of Producing Metal Material].

The gas to fill the storage container may be a gas containing 100 vol % $MoF_6$, or a gas of $MoF_6$ diluted with an inert gas such as nitrogen or argon. The gas to fill the storage container may be the same as or different from the gas to which the inner surface of the storage container is exposed.

EXAMPLES

Hereinafter, examples that specifically disclose the present disclosure are described. The present disclosure is not limited to these examples.

FIG. 1 is a schematic view illustrating an example of a semiconductor processing device used in examples and comparative examples.

A semiconductor processing device 1 illustrated in FIG. 1 includes a chamber 10 and a pipe 20 connected to the chamber 10. The chamber 10 is provided with a stage 12 to support a thermal oxide $SiO_2$ wafer 11 thereon.

To the pipe 20 is connected a storage container 30 filled with $MoF_6$ gas. $MoF_6$ gas can be supplied to the chamber 10 by opening valves V1 and V2.

Between the valves V1 and V2 is connected a pipe 21 extending from an inert gas supplier 40. An inert gas can be supplied to the chamber 10 by opening valves V2 and V3.

The chamber 10 is provided with a means for venting gas. In FIG. 1, gas is vented from the chamber 10 by a vacuum device 50 through a pipe 22. The pipe 22 is provided with a valve V4, which allows pressure adjustment. The chamber 10 also has a pressure indicator PI therein.

Example 1

In Example 1, a chamber 10 and pipes 20 to 22 made of a resin (PFA) and a storage container 30 made of a stainless steel (SUS304) were used. The storage container 30 was preprocessed under the conditions below.
<Preprocessing of Storage Container>
1. The storage container 30 was warmed to 40° C., and the atmosphere inside the container was replaced with an inert gas ($N_2$/He). The storage container 30 was then evacuated.
2. Into the storage container 30 was introduced 50 kPa of 100 vol % $MoF_6$ gas, which was retained for 24 hours.
3. The storage container 30 was evacuated of the $MoF_6$ gas.

A test piece (metal piece obtained by cutting SUS304 to a size of 20 mm×20 mm) was surface-treated under the same conditions as above, and analyzed by XPS. The analysis detected molybdenum and fluorine on the surface of the test piece, showing that a film containing a fluorine-containing molybdenum compound was formed on the surface of the test piece. Moreover, depth analysis by XPS with argon ion beam etching showed that the film had a thickness of about 85 nm.
<$MoF_6$ Flow Test>

The preprocessed storage container 30 was filled with 100 vol % $MoF_6$ gas. A $MoF_6$ flow test was then performed under the conditions below.
1. A thermal oxide $SiO_2$ wafer 11 was placed on the stage 12 in the chamber 10. The temperature of the stage 12 was set to 100° C.
2. The valves V1, V2, and V4 were opened, and the chamber 10 was evacuated using the vacuum device 50.
3. $MoF_6$ gas from the storage container 30 was passed at 100 sccm through the semiconductor processing device 1. At this time, the degree of opening of the valve V4 was adjusted such that the pressure indicator PI in the chamber 10 indicated 10 kPa.
4. After passing $MoF_6$ gas for 10 minutes, the atmosphere inside the chamber 10 was replaced with an inert gas.
5. The thermal oxide $SiO_2$ wafer 11 in the chamber 10 was taken out.
<Evaluation>

The surface of the thermal oxide $SiO_2$ wafer 11 after the $MoF_6$ flow test was observed with a scanning electron microscope (SEM). The number of particles (with a diameter of 100 nm or greater) adhering to the surface of the wafer was counted.

Comparative Example 1

The $MoF_6$ flow test was performed as in Example 1 except that a non-preprocessed storage container 30 was filled with the 100 vol % $MoF_6$ gas. The number of particles adhering to the surface of the wafer was counted.

Example 2

In Example 2, a chamber 10, pipes 20 to 22, and a storage container 30 made of a stainless steel (SUS304) were used. The storage container 30 was preprocessed under the same conditions as in Example 1. The chamber 10 and pipe 20 were preprocessed under the conditions below.
<Preprocessing of Chamber and Pipe>
1. The chamber 10 and the pipe 20 were heated to 150° C. The atmosphere inside the chamber 10 and the pipe 20 was replaced with an inert gas ($N_2$/He), and then the chamber 10 and the pipe 20 were evacuated.
2. Into the chamber 10 and the pipe 20 was introduced 50 kPa of $MoF_6$ gas, which was retained for 24 hours.
3. The chamber 10 and the pipe 20 were evacuated of the $MoF_6$ gas.

A test piece (metal piece obtained by cutting SUS304 to a size of 20 mm×20 mm) was surface-treated under the same conditions as above, and analyzed by XPS. The analysis detected molybdenum and fluorine on the surface of the test piece, showing that a film containing a fluorine-containing molybdenum compound was formed on the surface of the test piece. Moreover, depth analysis by XPS with argon ion beam etching showed that the film had a thickness of about 10 nm.
<Evaluation>

The preprocessed storage container 30 was filled with 100 vol % $MoF_6$ gas. Thereafter, the $MoF_6$ flow test was performed under the same conditions as in Example 1 using the preprocessed chamber 10 and pipe 20. The number of particles adhering to the surface of the wafer was counted.

Comparative Example 2

The $MoF_6$ flow test was performed as in Example 2 except that the chamber 10 and the pipe 20 were not preprocessed. The number of particles adhering to the surface of the wafer was counted.

Comparative Example 3

The $MoF_6$ flow test was performed as in Example 2 except that the chamber 10 and the pipe 20 were heated to 400° C. when they were preprocessed. The number of particles adhering to the surface of the wafer was counted.

Table 1 shows the preprocessing conditions and evaluation results.

TABLE 1

| | Storage container | | Pipe | | Chamber | | Evaluation results |
|---|---|---|---|---|---|---|---|
| | Material | Preprocess | Material | Preprocess | Material | Preprocess | (particles/cm²) |
| Example 1 | Stainless steel | Performed (40° C.) | Resin | Not performed | Resin | Not performed | <10 |

TABLE 1-continued

| | Storage container | | Pipe | | Chamber | | Evaluation results |
|---|---|---|---|---|---|---|---|
| | Material | Preprocess | Material | Preprocess | Material | Preprocess | (particles/cm$^2$) |
| Comparative Example 1 | Stainless steel | Not performed | Resin | Not performed | Resin | Not performed | >1,000 |
| Example 2 | Stainless steel | Performed (40° C.) | Stainless steel | Performed (150° C.) | Stainless steel | Performed (150° C.) | <10 |
| Comparative Example 2 | Stainless steel | Performed (40° C.) | Stainless steel | Not performed | Stainless steel | Not performed | >1,000 |
| Comparative Example 3 | Stainless steel | Performed (40° C.) | Stainless steel | Performed (400° C.) | Stainless steel | Performed (400° C.) | >1,000 |

Example 1 and Comparative Example 1 show that preprocessing using MoF$_6$ for the storage container 30 made of a stainless steel reduce the formation of particles.

Example 2 and Comparative Example 2 show that preprocessing using MoF$_6$ for the chamber 10 and the pipe 20 made of a stainless steel also reduce the formation of particles.

In Comparative Example 3, preprocessing at 400° C. with MoF$_6$ caused corrosion of the stainless steel, resulting in formation of particles.

The present application claims priority to Japanese Patent Application No. 2020-000352 filed on Jan. 6, 2020 under the Paris Convention and provisions of national law in a designated State. The entire content of the application is hereby incorporated by reference.

REFERENCE SIGNS LIST 1 semiconductor processing device
10 chamber
11 thermal oxide SiO$_2$ wafer
12 stage
20, 21, 22 pipe
30 storage container
40 inert gas supplier
50 vacuum device
PI pressure indicator
V1, V2, V3, V4 valve

The invention claimed is:

1. A metal material comprising:
a metal base; and
a film provided on a surface of the metal base and containing a fluorine-containing molybdenum compound,
the fluorine-containing molybdenum compound being represented by the formula MoO$_x$F$_y$, wherein x is a number from 0 to 2 and y is a number from 2 to 5.

2. The metal material according to claim 1,
wherein the metal base is made of at least one selected from the group consisting of a stainless steel, a manganese steel, aluminum, an aluminum alloy, nickel, and a nickel alloy.

3. The metal material according to claim 1,
wherein the film has a thickness of 1 nm or greater and 20 μm or smaller.

4. The metal material according to claim 1,
wherein the metal base is a pipe, a storage container, or a chamber, and
the film is provided on an inner surface of the metal base.

5. A method of producing the metal material according to claim 1, the method comprising
exposing a surface of the metal base to a MoF$_6$-containing gas at a temperature of 300° C. or lower to form the film containing the fluorine-containing molybdenum compound on the surface of the metal base.

6. The method of producing a metal material according to claim 5,
wherein the gas has a MoF$_6$ concentration of 5 vol % or higher and 100 vol % or lower.

7. A method of passivating a semiconductor processing device including a chamber made of the metal material according to claim 1 and a pipe connected to the chamber, the method comprising
exposing an inner surface of the chamber and an inner surface of the pipe to a MoF$_6$-containing gas at a temperature of 300° C. or lower to form the film containing the fluorine-containing molybdenum compound on the inner surface of the chamber.

8. The method of passivating a semiconductor processing device according to claim 7,
wherein the pipe is made of a metal material, and
the film is formed also on the inner surface of the pipe.

9. A method of producing a semiconductor device, comprising:
performing the method of passivating a semiconductor processing device according to claim 7; and
passing a MoF$_6$-containing gas through the semiconductor processing device.

10. A method of producing a filled container, comprising:
exposing an inner surface of a storage container made of the metal material according to claim 1 to a MoF$_6$-containing gas at a temperature of 300°° C. or lower to form the film containing the fluorine-containing molybdenum compound on the inner surface of the storage container; and
filling the storage container with a MoF$_6$-containing gas.

11. The metal material according to claim 1,
wherein the film has a thickness of 1 nm or greater and 1 μm or smaller.

* * * * *